United States Patent
Kerber et al.

(10) Patent No.: US 6,188,084 B1
(45) Date of Patent: *Feb. 13, 2001

(54) LOW INDUCTANCE SUPERCONDUCTIVE INTEGRATED CIRCUIT AND METHOD OF FABRICATING THE SAME

(75) Inventors: George L. Kerber, San Diego; Lynn A. Abelson, Rancho Palos Verdes; Raffi N. Elmadjian, Arcadia; Eric G. Ladizinsky, Canoga Park, all of CA (US)

(73) Assignee: TRW Inc., Redondo Beach, CA (US)

(*) Notice: Under 35 U.S.C. 154(b), the term of this patent shall be extended for 0 days.

This patent is subject to a terminal disclaimer.

(21) Appl. No.: 09/266,712

(22) Filed: Mar. 11, 1999

Related U.S. Application Data

(62) Division of application No. 08/833,954, filed on Apr. 11, 1997.

(51) Int. Cl.[7] .................................................. H01L 29/06
(52) U.S. Cl. .............................. 257/30; 257/34; 257/31; 438/2
(58) Field of Search ........................... 257/30, 31, 37, 257/35, 39; 505/204

(56) References Cited

U.S. PATENT DOCUMENTS

| | | | |
|---|---|---|---|
| 4,177,476 | 12/1979 | Kroger et al. | 357/5 |
| 4,220,959 | 9/1980 | Kroger | 357/5 |
| 4,430,662 | 2/1984 | Jillie, Jr. et al. | 357/5 |
| 4,498,228 | 2/1985 | Jillie, Jr. et al. | 29/577 C |
| 4,548,741 | 10/1985 | Hormadaly | 252/518 |
| 5,019,818 | 5/1991 | Lee | 341/133 |
| 5,021,658 | 6/1991 | Bluzer | 250/336.2 |
| 5,055,158 | 10/1991 | Gallagher et al. | 156/643 |
| 5,068,694 | 11/1991 | Ohara | 357/5 |
| 5,100,694 | 3/1992 | Hunt et al. | 427/63 |
| 5,114,912 | 5/1992 | Benz | 505/1 |
| 5,162,731 | 11/1992 | Fujimaki | 324/248 |
| 5,173,660 | 12/1992 | Marsden | 324/248 |
| 5,462,762 | 10/1995 | Onuma et al. | 427/63 |

OTHER PUBLICATIONS

Kerber et al.; "An Improved NbN Integrated Circuit Process Featuring Thick NbN Ground Plane and Lower Parasitic Circuit Inductances"; Aug., 1996.

Whiteley et al; "An All–NbN Time Domain Reflectometer Chip Functional Above 8 K"; IEEE Transactions on Magnetics, vol. 25, No. 2; Mar. 1989.

Kerber et al.; "An All Refractory NbN Josephson Junction Medium Scale Integrated Circuit Process"; Journal of Applied Physics; Nov. 1990.

Thomasson et al; "All Refractory NbN Integrated Circuit Process"; IEEE Transactions on Applied Superconductivity, vol. 3, No. 1; Mar. 1993.

*Primary Examiner*—Donald L. Monin, Jr.
*Assistant Examiner*—Douglas A. Wille
(74) *Attorney, Agent, or Firm*—Michael S. Yatsko

(57) ABSTRACT

A high-temperature (10 K) superconductive integrated circuit has a ground plane (2), an interlevel dielectric (6), and a low value resistor (18) to provide conductive paths to reduce parasitic circuit inductances, thereby increasing the speed and performance of the integrated circuit. The circuit also includes a high value resistor (20) connected between interconnect wires (34) to produce a desired resistance with a short distance between the interconnect wires (34), thereby significantly reducing the circuit area. A method of fabricating the integrated circuit includes depositing the interlevel dielectric (6) on the ground plane (2) in separate steps, depositing and etching the trilayer (12, 14, 16), etching the low value resistor (18) on the dielectric (6), depositing the high value resistor (20) at substantially the same level above the ground plane (2) as the interconnect wires (22) of the first wire layer (24), and etching the interconnect wires (34) of the second wire layer (32) on the high value resistor (20).

9 Claims, 2 Drawing Sheets

LOW INDUCTANCE SUPERCONDUCTIVE INTEGRATED CIRCUIT AND METHOD OF FABRICATING THE SAME

This application is a divisional of U.S. Ser. No. 08/833,954 filed Apr. 11, 1997.

BACKGROUND

The present invention relates to a low inductance superconductive integrated circuit and a method of fabricating the same, and in particular to a niobium nitride (NbN) based superconductive integrated circuit with reduced circuit inductances.

At the present time, there are two major types of superconductive integrated circuits, one of which uses niobium (Nb) and the other uses niobium nitride (NbN). Nb-based superconductive integrated circuits generally have low parasitic circuit inductances, and are therefore suitable for high-speed and high-frequency operations. However, a disadvantage of the Nb-based superconductive integrated circuits is that the temperature required for the operation of such circuits is close to 4 K, which necessitates the use of liquid helium. Liquid helium requires complicated and expensive refrigerating systems. On the other hand, NbN-based superconductive integrated circuits have been developed for operation at temperatures above the liquid helium temperature. NbN-based circuits can operate at a temperature of 10 K or higher, which can be achieved and maintained by a relatively simple closed-cycle refrigerator.

However, typical thin films of NbN used in the fabrication of superconductive integrated circuits exhibit relatively large penetration depth in the range of about 250–350 nm. A large penetration depth gives rise to high parasitic inductances in the NbN-based superconductive integrated circuit which degrades circuit speed and performance. Conventional NbN-based integrated circuits generally have slower operational speeds than those of Nb-based integrated circuits.

Another disadvantage of conventional NbN-based superconductive integrated circuits is that their circuit densities are generally low. A typical NbN process has only a low value resistor with a sheet resistance in the range of about 0.5–2 ohms/square. In the conventional process, the low value resistor can only be connected to the circuit through a second level metal. There are two disadvantages associated with this arrangement. First, the second level metal has an undesirable parasitic inductance which reduces the circuit speed. Second, because of the low sheet resistance, a large circuit resistance requires a large number of squares which consume a significant amount of the circuit's surface area, thereby decreasing the circuit density.

Therefore, there is a need for a NbN-based superconductive integrated circuit that has low parasitic circuit inductances to enable high-speed operations. Furthermore, there is a need for increasing the circuit density to reduce circuit area so that larger scale integration can be achieved.

SUMMARY OF THE INVENTION

The present invention satisfies these needs. In view of the above problems, the present invention provides a NbN-based superconductive integrated circuit that has low parasitic circuit inductances and a high circuit density, and a method of fabricating the same. The superconductive integrated circuit generally comprises:

(a) a superconductive ground plane having a ground plane surface;

(b) a plurality of superconductive interconnect wire layers including a first wire layer and a second wire layer, the wire layers each having a plurality of interconnect wires, and the interconnect wires of the first wire layer having a plurality of contacts including at least one tunnel junction contact;

(c) an interlevel dielectric on the ground plane surface, the interlevel dielectric having contoured outer and inner surfaces that are adapted to accept the first and second wire layers;

(d) at least one superconductive base electrode having at least one tunnel junction and at least one contact to provide a conductive path between the base electrode and tunnel junction, the base electrode having an interconnect inductance;

(e) at least one tunnel barrier on the base electrode;

(f) at least one superconductive counter electrode connected between at least one of the interconnect wires of the first wire layer and the tunnel barrier;

(g) at least one low value resistor within the interlevel dielectric, the low value resistor connected between at least two of the interconnect wires and positioned with respect to the tunnel junction to reduce the interconnect inductance; and (h) at least one high value resistor connected between at least two of the interconnect wires to provide a sheet resistance substantially higher than that of the low value resistor, thereby reducing the physical size of the resistor and surface area of the integrated circuit.

The present invention also provides a method of fabricating the superconductive integrated circuit. The method generally comprises the steps of:

(a) providing a patterned ground plane;

(b) depositing and patterning a first dielectric layer on the ground plane;

(c) depositing a trilayer consisting essentially of a base electrode, a tunnel barrier, and a counter electrode on the first dielectric layer;

(d) patterning and etching the superconductive counter electrode upon the tunnel barrier and removing the tunnel barrier everywhere except under the counter electrode and in the vicinity of the counter electrode;

(e) patterning and etching the superconductive base electrode on the first dielectric layer;

(f) depositing a second dielectric layer on the base electrode and the counter electrode;

(g) depositing and patterning at least one low value resistor in the second dielectric layer, the low value resistor being positioned to connect at least two of the first interconnect wires;

(h) depositing a third dielectric layer to insulate a portion of the low value resistor, and patterning and etching contacts to the low value resistors;

(i) patterning and etching contacts in the second and third dielectric layers to contact the base electrode and the counter electrode;

(j) depositing and patterning the first wire layer in the dielectric layers so that at least some of the interconnect wires of the first wire layer are electrically connected with the counter electrode, the base electrode, the low value resistor, and the ground plane;

(k) depositing and patterning at least one high value resistor that is adapted to connect with at least two of the interconnect wires;

(l) depositing a fourth dielectric layer to partially insulate the second wire layer and the high value resistor, the first, second, third and fourth dielectric layers together forming an interlevel dielectric, and patterning and etching contacts in the fourth dielectric layer; and (m) depositing and patterning the second wire layer at selected locations on the first wire layer and the interlevel dielectric so that at least some of the interconnect wires of the second wire layer have electrical contact with the first wire layer and the high value resistor.

The present invention is applicable to trilayer superconductive integrated circuits, and is particularly applicable to NbN/MgO/NbN-based integrated circuits. The ground plane preferably comprises NbN, and the interlevel dielectric layer preferably comprises silicon dioxide ($SiO_2$). The low value resistor is made of a low resistance metallic material, preferably molybdenum (Mo). The high value resistor provides a high sheet resistance and is preferably made of a metallic, non-superconducting compound of $NbN_x$.

Advantageously, the low value molybdenum resistors having a sheet resistance of approximately 1 ohm/square, are typically used to shunt junctions with first interconnect wires, are placed adjacent the junction contacts to reduce the shunted junction inductance. Moreover, the high value $NbN_x$ resistors are preferably positioned to connect the interconnect wires of the second NbN wire layer. It is further preferred that the high value $NbN_x$ resistor be deposited through a liftoff mask which allows it to be fabricated at the same level above the NbN ground plane as a first NbN interconnect wire layer. One of the interconnect wires of the second wire layer can have a direct contact with the ground plane through one of the interconnect wires of the first wire layer and base electrode, and the contact is called a stacked contact. The use of high value $NbN_x$ resistors having a sheet resistance of approximately 12 ohms per square significantly reduces circuit area.

BRIEF DESCRIPTION OF THE DRAWINGS

These and other features, aspects and advantages of the present invention will become understood with reference to the following description, appended claims and accompanying drawings where:

DETAILED DESCRIPTION OF THE PREFERRED EMBODIMENTS

The present invention provides superconductive integrated circuit with a superconductive ground plane and a thin interlevel dielectric to reduce the inductance per square of all wiring layers, a low sheet resistance, low value resistor to reduce shunted junction inductance, and a high value resistor with a high sheet resistance to reduce circuit area. The invention is applicable to fabrication of a trilayer process NbN-based integrated circuit, and more specifically to fabrication of a NbN/MgO/NbN superconductive integrated circuit. Other types of high-temperature (10 K) superconductive integrated circuits to which the present invention can be applicable include circuits using NbN/AlN/NbN aluminum nitride (AlN) tunnel barrier trilayers or other suitable tunnel barrier materials. A disadvantage of conventional NbN-based circuits without ground planes is that they generally have high parasitic circuit inductances, which are contributed by the inductance per square of all wiring layers and the shunted junction inductance of junction contacts. Parasitic inductances undesirably limit circuit speed and performance. Moreover, conventional NbN-based integrated circuits generally have low circuit densities because the resistors used in the circuits have low sheet resistances at the operating temperature of about 10 K for the NbN superconductor. The architecture of the integrated circuit in accordance with the present invention reduces parasitic circuit inductances and increases circuit density, so that the NbN circuits fabricated according to the present invention will have performances comparable to the present Nb-based low-temperature (4 K) superconductive integrated circuits.

Detailed descriptions of the preferred embodiments of the superconductive integrated circuit and the method of fabricating the same in accordance with the present invention are described as follows:

A. Superconductive Integrated Circuit

Figure 1:
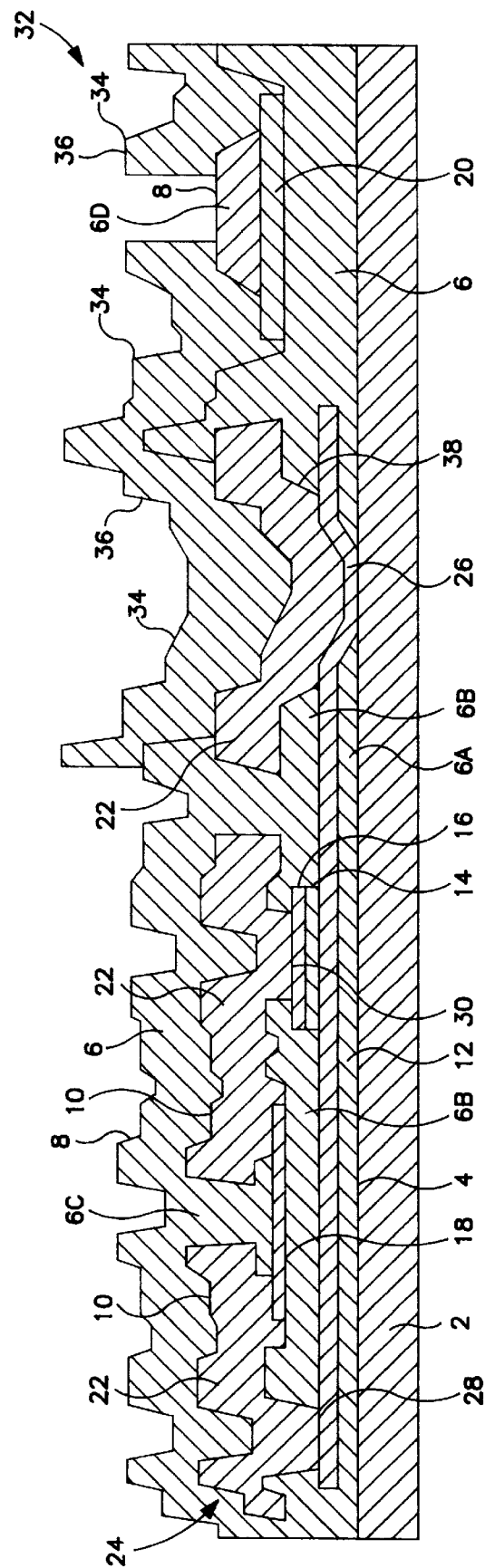
FIG. 1 is a sectional view of a superconductive integrated circuit in accordance with the present invention.

FIG. 1 is a sectional view of a preferred embodiment of a superconductive integrated circuit in accordance with the present invention, which is particularly applicable to a NbN/MgO/NbN-based circuit. The integrated circuit has a ground plane 2 with a substantially flat ground plane surface 4 upon which interlevel dielectric layers 6 are deposited. The interlevel dielectric layers have contoured or patterned outer and inner surfaces 8 and 10, respectively. The inner surfaces 10 are contoured to accept a base electrode 12, a tunnel barrier 14, a counter electrode 16, a low value resistor 18 having a low resistivity, a high value resistor 20 having a high sheet resistance, and a plurality of interconnect wires 22 of the first interconnect wire layer 24. The interlevel dielectric 6 is preferably deposited in several separate steps so that the base electrode 12, the tunnel barrier 14, the counter electrode 16, the resistors 18 and 20, and the first interconnect wire layer 24 are enclosed within the interlevel dielectric. These process steps are described in detail in section B on the method of fabrication below. The dielectric portions or layers that are deposited according to the preferred embodiment of section B are indicated by 6a, 6b, 6c, and 6d, which as a whole form the interlevel dielectric 6.

For a NbN/MgO/NbN superconductive integrated circuit, the ground plane is preferably NbN and the interlevel dielectric is preferably silicon dioxide ($SiO_2$). The ground plane 2 preferably has a thickness of about 500 nm. The base electrode 12 is a wire layer of NbN with a preferred thickness of about 100 nm. The base electrode is generally in parallel with the ground plane surface 4 and is separated from the ground plane by the interlevel dielectric 6a with a preferred spacing of about 150 nm, except for a portion 26 which is contoured to directly contact with the ground plane 2. The interconnect wires 22 of the first wire layer 24 have a plurality of junction contacts 28 and 30. Some of the junction contacts, such as contact 28, are directly connected to the base electrode 12. Another type of junction contact 30 has a layer of NbN counter electrode 16 beneath it. The counter electrode preferably has a thickness of about 100 nm. Between the counter electrode 16 and the base electrode 12 is a very thin tunnel barrier layer 14, which is preferably of a metal oxide material. It is further preferred that the tunnel barrier 14 be a magnesium oxide (MgO) barrier having a thickness on the order of 1.0 nanometer for a trilayer NbN/MgO/NbN integrated circuit.

The circuit also includes a second layer 32 of interconnect wires 34 which are generally positioned higher above the ground plane 2 than the first wire layer 24. At least some portions of the surfaces 36 of the second wire layer are exposed along with portions of the outer surfaces 8 of the interlevel dielectric 6. In contrast with the second wire layer 32, the interconnect wires 22 of the first wire layer 24 have no exposed surfaces when fabrication is complete. One of the interconnect wires 34 of the second wire layer 32 can have a direct contact to the ground plane through at least one of the interconnect wires 22 of the first wire layer 24, and this contact is called a stacked contact 38. The interconnect wire of the first wire layer upon which the stacked contact is positioned is preferably in direct contact with the contoured portion 26 of the base electrode 12. The contoured portion 26 is in direct contact with the ground plane 2.

The high value resistor 20 is a planar layer of a resistive material connected between at least two of the interconnect wires. For a NbN/MgO/NbN integrated circuit, the high value resistor 20 preferably comprises a niobium nitride compound $NbN_x$, where x is generally much less than 1 and is preferably on the order of about 1/10. This high value $NbN_x$ resistor has a sheet resistance of approximately 12 ohms/square, which is significantly higher than that of a low value resistor with a sheet resistance generally in the range of about 0.5–2 ohms/square in a conventional NbN integrated circuit. Other values of x can also be used to produce a desired sheet resistance to optimize circuit design. Although the high value resistor can be used to connect different interconnect wires of either the first wire layer or the second wire layer, it is preferred that the high value resistor be positioned to connect the interconnect wires of the second wire layer. It is further preferred that the high value $NbN_x$ resistor be positioned at substantially the same level above the ground plane as the first interconnect wire layer. An advantage of this arrangement is that only one contact mask is needed for etching both the first wire layer and the high value resistor for reasons described in section B on the method of fabrication below. Compared to a conventional NbN-based integrated circuit, the high sheet resistance of the high value $NbN_x$ resistor in the present invention enables the distances between the different interconnect wires connected by the high value resistors to be much shorter, thereby significantly decreasing the circuit area. By using $NbN_x$ resistors instead of conventional low value resistors, the circuit area of a NbN-based integrated circuit can be reduced by as much as 70%.

The present invention also provides a low value resistor 18 to reduce shunted junction inductance. For a NbN-based superconductive integrated circuit, it is preferred that the low value resistor be a molybdenum (Mo) resistor. Although the low value resistor can be connected across two or more interconnect wires of either the first wire layer or the second wire layer, it is preferred that the low value resistor be connected between interconnect wires of the first wire layer. In the arrangement shown in FIG. 1, the low value resistor 18 is a layer of molybdenum that is directly connected between two interconnect wires 22 of the first wire layer 24 within the interlevel dielectric 6. To construct low parasitic inductance shunted junctions, it is preferred that the low value resistor 18 be positioned substantially in parallel with the base electrode 12 and directly over the base electrode separated by dielectric 6b. It is further preferred that the low value resistor 18 be connected with the interconnect wires 22 at locations adjacent the junction contacts 28 and 30 so that a closed loop is formed between the interconnect wires 22, the low value resistor 18, the counter electrode 16, the tunnel barrier 14, and the base electrode 12. This closed loop formed by the low value molybdenum resistor 18 connected across the interconnect wires 22 of the first wire layer 24 significantly reduces the shunted junction inductance of the interconnect wires of the first wire layer. Moreover, the ground plane 2 is provided with a conductive path to the stacked contact 38 through a direct contact with the contoured portion 26 of the base electrode 12, thereby reducing the inductance of the interconnect wires 22 and 34 of the first and second wire layers 24 and 32, respectively. With reduced shunted junction inductances and inductance per square of all wiring layers, the overall parasitic circuit inductance can be reduced, thereby increasing the speed of the NbN-based high-temperature (10 K) superconductive integrated circuit.

The sectional view of FIG. 1 shows the interconnect wires 22 and 34 having lateral surfaces not perpendicular to the ground plane, so that each interconnect wire has a cross-sectional shape that is approximately a superposition of a plurality of trapezoids. These cross-sectional shapes are the results of etching NbN on $SiO_2$; however, practitioners in the art recognize that the present invention is not limited to the interconnect wires of these cross-sectional shapes. The low value resistor 18 and the high value resistor 20 can be connected between interconnect wires of cross-sectional shapes other than those shown in FIG. 1.

B. Method of Fabrication

Figure 2:
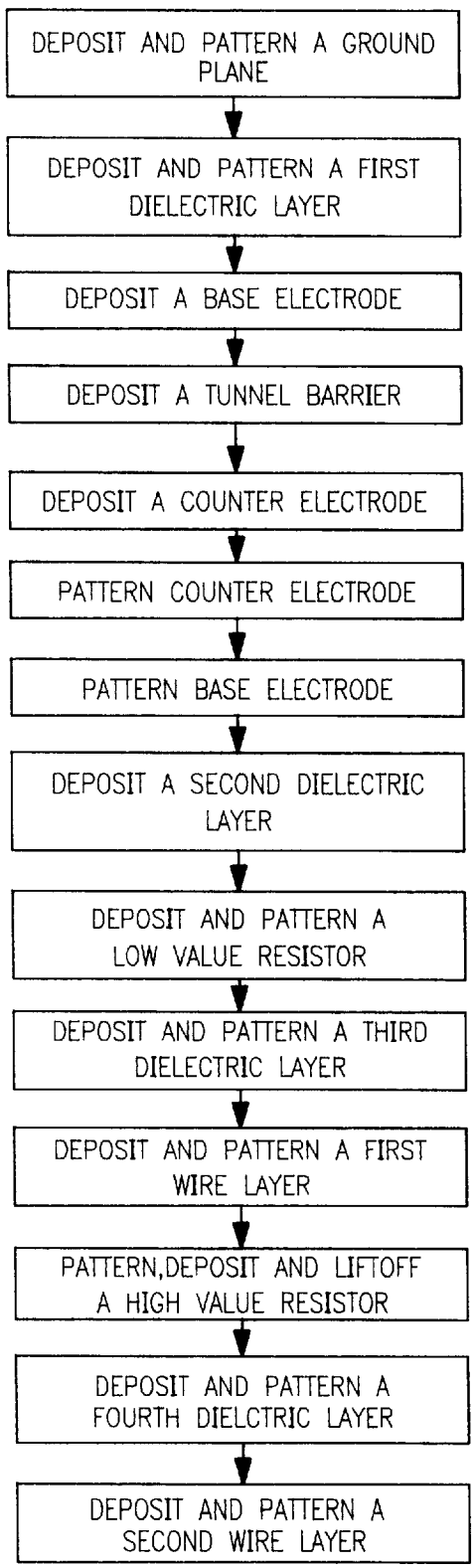
FIG. 2 is a block diagram showing the process steps of fabricating the superconductive integrated circuit according to the present invention.

FIG. 2 shows a block diagram of a preferred embodiment of a method for fabricating the superconductive integrated circuit described in section A above. The method generally comprises the steps of:

(a) providing a patterned ground plane;

(b) depositing and patterning a first dielectric layer on the ground plane;

(c) depositing a trilayer consisting essentially of a base electrode, a tunnel barrier and a counter electrode on the first dielectric layer;

(d) patterning and etching the superconductive counter electrode upon the tunnel barrier, and selectively removing the tunnel barrier upon the base electrode;

(e) patterning and etching the superconductive base electrode on the first dielectric layer;

(f) depositing a second dielectric layer;

(g) depositing and patterning at least one low value resistor in the second dielectric layer, the low value resistor being positioned to connect at least two of the interconnect wires;

(h) depositing a third dielectric layer to insulate the low value resistor, and patterning and etching contacts in the third dielectric layer to the resistors;

(i) patterning and etching contacts in the second and third dielectric layers to contact the base electrode and the counter electrode;

(j) depositing and patterning the first wire layer in the dielectric layers so that at least some of the interconnect wires of the first wire layer are electrically connected with the counter electrode and the base electrode, the low value resistor, and the ground plane;

(k) depositing and patterning at least one high value resistor that is adapted to connect with at least two of the interconnect wires;

(l) depositing a fourth dielectric layer to partially insulate the second wire layer and the high value resistor, the first, second, third and fourth dielectric layers together forming the interlevel dielectric, and patterning and etching contacts in the fourth dielectric layers; and (m) depositing and etching the second wire layer at selected locations on the first wire layer and the interlevel dielectric so that at least some of the interconnect wires of the second wire layer have electrical contact with the first wire layer and the high value resistor.

The preferred materials for each of the process steps, the preferred thicknesses of the materials, and the tolerances that are defined as three times the standard deviation (3σ) from the preferred thicknesses are listed in Table 1 below:

TABLE 1

| Use | Material | Nominal (Target) Thickness | 3σ Variation from Nominal Thickness |
|---|---|---|---|
| Ground plane | NbN | 500 nm | 15% |
| Ground plane insulation | SiO$_2$ | 150 nm | 15% |
| Junction base electrode | NbN | 100 nm | 15% |
| Junction tunnel barrier | MgO | 1 nm | N/A |
| Junction counter electrode | NbN | 100 nm | 15% |
| Trilayer insulation | SiO$_2$ | 200 nm | 15% |
| Low value resistor | Mo | 100 nm | 15% |
| Resistor insulation | SiO$_2$ | 100 nm | 15% |
| First NbN wireup layer | NbN | 500 nm | 15% |
| High value resistor | NbN$_x$ | 150 nm | 15% |
| Second wireup insulation | SiO$_2$ | 600 nm | 15% |
| Second wireup layer | NbN | 1000 nm | 15% |

First, a ground plane 2 is provided with a substantially flat surface 4 as in FIG. 1. The ground plane is much thicker than the base electrode and preferably has a thickness of about 500 nm, although other thicknesses can also be used. A first dielectric layer 6a, which is part of the interlevel dielectric 6, is deposited on the ground plane surface 4 to provide insulation for the ground plane. It is preferred that the thickness of the first dielectric layer 6a be on the order of about 150 nm. For a NbN ground plane, the material for the dielectric is preferably SiO$_2$. The first dielectric layer covers a majority of the ground plane surface 4 except for a portion of the ground plane upon which the contoured portion 26 of the base electrode 12 is directly deposited to form a direct electrical contact the ground plane. Advantageously, the interlevel dielectric 6 is deposited in four separate steps in the fabrication process as four dielectric layers 6a, 6b, 6c and 6d as indicated in FIG. 1.

The junction base electrode 12 is preferably etched on the first dielectric layer 6a as a relatively thin NbN layer, on the order of about 100 nm, generally in parallel with the ground plane except for the contoured portion 26 where the base electrode is in direct contact with the ground plane. A very thin tunnel barrier, preferably of MgO with a thickness on the order of about 1 nm, covers a portion of the base electrode. Although MgO is the preferred material for the junction tunnel barrier in a NbN-based integrated circuit, the present invention is also applicable to trilayer integrated circuits with other types of junction tunnel barriers, such as AlN, oxidized metal, or semiconductor barriers. The junction counter electrode 16, preferably of NbN with a preferred thickness of about 100 nm, is etched on top of the tunnel barrier 14. The counter electrode, the tunnel barrier, and the base electrode together form a "trilayer," which is preferably NbN/MgO/NbN for a NbN-based integrated circuit. The NbN counter electrode, the MgO barrier, and the NbN base electrode trilayer are deposited, in-situ, in sequence and patterned and etched in separate masking steps. A second dielectric layer 6b is deposited on the patterned trilayer.

Subsequent to the deposition of the second dielectric layer 6b, a low value resistor 18 is etched on the layer at a pre-determined location to form direct electrical contacts with designated interconnect wires of the first wire layer. It is preferred that the low value resistor comprise a molybdenum layer with a thickness on the order of 100 nm, although other materials with low resistivities can also be used. Subsequent to the deposition of the low value resistor 18, the third dielectric layer 6c is preferably deposited to insulate the low value resistor. Contacts to the resistor 18 are patterned and etched in the third dielectric layer 6c for direct contact with the interconnect wires 22 of the first wire layer 24. It is preferred that the low value molybdenum resistor be etched on the dielectric by a conventional reactive ion etch process. Subsequently, contacts 28 and 30 to the base electrode 12 and the counter electrode 16 are patterned and etched in the second and third dielectric layers 6b and 6c for direct contact with interconnect wires 22 of the first wire layer 24.

The interconnect wires 22 of the first wire layer 24, which comprise NbN with a thickness generally on the order of about 500 nm, are etched on the dielectric layers 6b and 6c. It is preferred that the first wire layer be etched by using a conventional reactive ion etch process, in a step separate from the reactive ion etch of the low value molybdenum resistor. Some of the interconnect wires of the first wire layer have junction contacts similar to contact 28, which is in direct contact with the base electrode 12. Some of the other interconnect wires of the first wire layer have junction contacts similar to contact 30, which is in direct contact with the counter electrode 16. Another type of interconnect wires of the first wire layer have direct contact with the contoured portion 26 of the base electrode which is directly connected to the ground plane. The top surface of this interconnect wire is to be deposited with an interconnect wire 34 of the second wire layer 32. Because of different etching characteristics for molybdenum and for NbN, separate contact masks and optimized reactive ion etches for resistor contacts and for base and counter electrode contacts are used.

A high value resistor 20 is deposited on the dielectric 6 at predetermined locations that are adapted to connect with at least two of the interconnect wires 34 of the second wire layer 32. For a NbN-based superconductive integrated circuit, the high value resistor is preferably NbN$_x$, with x much less than 1 and generally on the order of about 1/10. The high value NbN$_x$ resistor is preferably a sheet layer with a thickness of about 150 nm and has a sheet resistance of approximately 12 ohms/square. It is preferred that the high value NbN$_x$ resistor 20 be deposited through a lift-off mask which allows it to be fabricated at generally the same level above the NbN ground plane as the first wire layer 24. A fourth dielectric layer 6d is then deposited to insulate the high value resistor 20 and first wire layer 24 from the third wire layer 32. Contacts to the high value resistor 32 and first wire layer 24 are patterned and etched by using one mask Since the counter reactive etch ion overetch characteristics of the NbN$_x$ resistor and the NbN interconnect wires of the first wire layer are similar, only one contact mask is needed for both. Contact between the second wire layer and the ground plane through the first wire layer is called a stacked contact 38, which is positioned directly above the contoured base electrode portion 26 that is in direct contact with the ground plane 2. The second wire layer comprises NbN with a thickness generally on the order of 1000 nm. The high value NbN$_x$ resistor is connected across two interconnect wires of the second wire layer. For a desired resistance between the two interconnect wires, the high sheet resistance of the high value resistor in the present invention significantly shortens the distance between the two wires. With a NbN$_x$ resistor having a sheet resistance of about 12 ohms/square, the circuit area can be decreased by as much as 70% compared to the use of a conventional low value resistor with a sheet resistance in the range of about 0.5–2 ohms/square. Moreover, the $NbN_x$ resistor is stable and non-superconducting below the circuit's operating temperature of about 10 K, thereby avoiding the possibility of a short circuit at lower operating temperatures.

The present invention has been described in considerable detail with reference to certain preferred embodiments thereof; however, other embodiments are possible. Therefore, the spirit and scope of the appended claims should not be limited to the description of the preferred embodiments contained herein.

What is claimed is:

1. A low inductance NbN/MgO/NbN superconductive integrated circuit, comprising:

(a) a niobium nitride (NbN) ground plane having a substantially flat ground plane surface;

(b) a plurality of NbN interconnect wire layers including a first wire layer and a second wire layer, the wire layers each having a plurality of interconnect wires, at least some of the interconnect wires of the second wire layer being deposited on the first wire layer, and the interconnect wires of the first wire layer having a plurality of junction contacts;

(c) an interlevel dielectric deposited on the ground plane surface, the interlevel dielectric having outer and inner surfaces etched to form a plurality of recesses that are contoured to accept the first and second wire layers, such that the first and second wire layers are unequally spaced from the ground plane surface;

(d) at least one NbN base electrode having tunnel junctions and contacts to provide a conductive path between the base electrode and the tunnel junctions, the base electrode having an inner connect inductance;

(e) at least one magnesium oxide (MgO) barrier deposited on the base electrode;

(f) at least one NbN counter electrode etched in the interlevel dielectric and connected between at least one of the interconnect wires of the first wire layer and the tunnel barrier;

(g) at least one low value resistor etched within the interlevel dielectric and connected between at least two of the interconnect wires, the low value resistor being proximate to the tunnel junction to reduce the interconnect inductance; and (h) at least one high value resistor etched in the interlever dielectric and connected between at least two of the interconnect wires of the second wire layer and positioned at substantially the same level above the ground plane as the first wire layer to provide a sheet resistance substantially higher than that of the low value resistor, thereby reducing the physical size of the resistor and surface area of the integrated circuit.

2. The superconductive integrated circuit of claim 1, wherein the low value resistor comprises molybdenum (Mo).

3. The superconductive integrated circuit of claim 1, wherein the high value resistor comprises $NbN_x$.

4. The superconductive integrated circuit of claim 1, wherein the interlevel dielectric comprises silicon dioxide ($SiO_2$).

5. The superconductive integrated circuit of claim 1, wherein the high value resistor is connected between at least two of the interconnect wires of the second wire layer.

6. The superconductive integrated circuit of claim 1, wherein the low value resistor is connected between at least two of the interconnect wires of the first wire layer.

7. The superconductive integrated circuit of claim 6, wherein at least some of the inner surfaces within the interlevel dielectric are contoured so that the interconnect wires of the first wire layer are unequally spaced from the ground plane surface, portions of the interconnect wires of the first wire layer being closest to the ground plane surface defining the junction contacts connected by the base electrode, and the low value resistor is connected between the interconnect wires of the first wire layer, the low value resistor being adjacent to the junction contacts and substantially in parallel with the base electrode.

8. The superconductive integrated circuit of claim 1, wherein one of the interconnect wires of the first wire layer is directly connected to one of the interconnect wires of the second wire layer to form a stacked contact that is electrically connected to the ground plane.

9. The superconductive integrated circuit of claim 8, wherein the stacked contact is electrically connected to the ground plane via the base electrode.

* * * * *